(12) United States Patent
Stratmann et al.

(10) Patent No.: US 11,796,060 B2
(45) Date of Patent: Oct. 24, 2023

(54) DEVICE FOR SEALING TWO SPACES FILLED WITH DIFFERENT FLUIDS IN A MEMS SENSOR SYSTEM

(71) Applicant: Robert Bosch GmbH, Stuttgart (DE)

(72) Inventors: Egon Stratmann, Ludwigsburg (DE); Marcus Mutschler, Pleidelsheim (DE); Wolfgang Wettemann-Del Chin, Sersheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 174 days.

(21) Appl. No.: 17/040,333

(22) PCT Filed: Apr. 15, 2019

(86) PCT No.: PCT/EP2019/059684
§ 371 (c)(1),
(2) Date: Sep. 22, 2020

(87) PCT Pub. No.: WO2019/206721
PCT Pub. Date: Oct. 31, 2019

(65) Prior Publication Data
US 2021/0018096 A1    Jan. 21, 2021

(30) Foreign Application Priority Data

Apr. 26, 2018   (DE) .......................... 102018206477.6

(51) Int. Cl.
*F16J 15/06*   (2006.01)
*B81B 3/00*   (2006.01)
(Continued)

(52) U.S. Cl.
CPC .......... *F16J 15/064* (2013.01); *B81B 3/0059* (2013.01); *F16J 15/028* (2013.01); *F16J 15/062* (2013.01);
(Continued)

(58) Field of Classification Search
CPC .......... B81B 2201/0264; B81B 3/0059; G01L 19/0046; F16L 55/13; F16J 15/062; F16J 15/028; F16J 15/064
See application file for complete search history.

(56) References Cited

U.S. PATENT DOCUMENTS

RE24,329 E  *  6/1957  Booth .................... F16L 55/115
                                                    277/637
3,206,216  A  *  9/1965  Crook .................... F16J 15/104
                                                    210/450
(Continued)

FOREIGN PATENT DOCUMENTS

AU           726966 B2       11/2000
CN        102686460 A         9/2012
(Continued)

OTHER PUBLICATIONS

International Search Report for PCT/EP2019/059684, dated Jul. 19, 2019.

*Primary Examiner* — Eugene G Byrd
(74) *Attorney, Agent, or Firm* — NORTON ROSE FULBRIGHT US LLP; Gerard Messina

(57) ABSTRACT

A sealing device for sealing a space filled with a fluid in a MEMS sensor system. The sealing device includes a sealing unit, the sealing unit encompassing a channel, which is connected to the one space, and a sealing element for sealing the channel being situated in the channel in such a way that the channel and/or the sealing element are/is designed in such a way that the sealing element is sealingly fixed in the channel via a mechanical clamping.

10 Claims, 2 Drawing Sheets

(51) Int. Cl.
  *F16J 15/02* (2006.01)
  *F16L 55/13* (2006.01)
  *G01L 19/00* (2006.01)
(52) U.S. Cl.
  CPC .......... *F16L 55/13* (2013.01); *G01L 19/0046* (2013.01); *B81B 2201/0264* (2013.01)

(56) References Cited

U.S. PATENT DOCUMENTS

| | | | | |
|---|---|---|---|---|
| 3,525,365 | A * | 8/1970 | Boyle | F16B 3/06 |
| | | | | 215/358 |
| 3,952,395 | A | 4/1976 | Crossman et al. | |
| 4,052,233 | A * | 10/1977 | Strauff | F16L 55/13 |
| | | | | 148/211 |
| 4,380,302 | A * | 4/1983 | Broad | F16J 13/12 |
| | | | | 220/288 |
| 5,295,293 | A | 3/1994 | Pfeiffer | |
| 5,516,122 | A * | 5/1996 | Caffee | F16L 23/20 |
| | | | | 285/918 |
| 5,557,971 | A * | 9/1996 | Uemura | G01L 23/18 |
| | | | | 73/702 |
| 5,741,974 | A * | 4/1998 | Uemura | G01L 19/147 |
| | | | | 338/42 |
| 2003/0152463 | A1* | 8/2003 | Shuler | F04B 43/043 |
| | | | | 417/394 |
| 2004/0016898 | A1 | 1/2004 | Cox et al. | |
| 2005/0242525 | A1* | 11/2005 | Dahlke | F23R 3/002 |
| | | | | 277/605 |
| 2012/0174682 | A1* | 7/2012 | Rozgo | G01L 19/0007 |
| | | | | 73/727 |
| 2013/0020768 | A1* | 1/2013 | Ruckh | B60T 11/236 |
| | | | | 277/312 |
| 2013/0075405 | A1* | 3/2013 | Saito | F04B 39/121 |
| | | | | 220/328 |
| 2014/0216163 | A1* | 8/2014 | Thiele | G01L 19/0645 |
| | | | | 29/592.1 |
| 2015/0298034 | A1 | 10/2015 | Jung et al. | |
| 2016/0238247 | A1* | 8/2016 | Staufer | F23R 3/06 |
| 2017/0234751 | A1* | 8/2017 | Aoyama | G01L 19/0084 |
| | | | | 73/706 |
| 2017/0370469 | A1* | 12/2017 | Roborel De Climens | F16J 15/12 |
| 2021/0247014 | A1* | 8/2021 | Al-Gouhi | F16L 55/1657 |

FOREIGN PATENT DOCUMENTS

| | | | |
|---|---|---|---|
| DE | 4431593 A1 | 3/1996 | |
| DE | 102008044098 A1 | 6/2010 | |
| DE | 102012213917 A1 | 2/2014 | |
| DE | 102015203779 A1 | 9/2016 | |
| EP | 2775249 A2 * | 9/2014 | ............ B30B 15/04 |
| JP | 2012163144 A * | 8/2012 | ............ F16J 15/062 |

\* cited by examiner

DEVICE FOR SEALING TWO SPACES FILLED WITH DIFFERENT FLUIDS IN A MEMS SENSOR SYSTEM

FIELD

The present invention relates to a sealing device for sealing a space filled with a fluid in a MEMS sensor system.

Moreover, the present invention relates to a pressure sensor, in particular for use in air conditioning systems or the like, preferably in vehicles.

The present invention also relates to a method for sealing a space filled with a fluid in a MEMS sensor system.

BACKGROUND INFORMATION

Although the present invention is applicable, in general, to arbitrary fluids, the present invention is explained with respect to oil as the first fluid and air as the second fluid.

Although the present invention is applicable, in general, to arbitrary sensor systems, the present invention is explained with respect to pressure sensors.

Although the present invention is usable, in general, in arbitrary fields, the present invention is explained with respect to vehicle air conditioning systems.

Vehicle air conditioning systems enhance the comfort of vehicle occupants, in particular in the summer months, in that they lower the internal temperature of the vehicle in the case of intense solar radiation. A refrigerant agent is utilized for this purpose in the vehicle air conditioning system.

Conventional vehicle air conditioning systems also include pressure sensors for measuring the pressure of the refrigerant agent in the air conditioning system in the vehicle, in order to be able to detect leakages. In the case of conventional pressure sensors, the pressure sensor element, which is located, for example, on a circuit board, is physically separated from the refrigerant medium by a so-called oil reservoir, in order to protect the sensor element from effects of the refrigerant agent. The oil reservoir is filled with oil and, thereafter, is tightly closed.

SUMMARY

In one specific embodiment, the present invention provides a sealing device for sealing a space filled with a fluid in a MEMS sensor system, including a sealing unit, the sealing unit encompassing a channel, which is connected to the one space, and a sealing element for sealing the channel being situated in the channel in such a way that the channel and/or the sealing element are/is designed in such a way that the sealing element is sealingly fixed in the channel via a mechanical clamping.

In one further specific embodiment, the present invention provides a pressure sensor, in particular for use in air conditioning systems or the like, preferably in vehicles, including a sensor element, which is situated in a space and is at least partially surrounded by a fluid, and the space being sealed with the aid of a sealing unit, and the sealing unit encompassing a channel, which is connected to the space, and a sealing element for sealing the channel being situated in the channel in such a way that the channel and/or the sealing element are/is designed in such a way that the sealing element is sealingly fixed in the channel via a mechanical clamping. In one further specific embodiment, the present invention provides a method for sealing two spaces filled with different fluids in a MEMS sensor system, including the steps:

providing a fluid connection to a closed space,
placing a sealing unit in the fluid connection, the sealing unit including a channel, which is connected to the space,
inserting a sealing element into the channel, and
fixing the sealing element in the channel in order to seal the channel at least via a mechanical clamping.

One of the advantages achieved therewith may be that, despite the usually limited installation space in a MEMS sensor system, an extremely tight connection between two spaces or an extremely tight closure of a space may be achieved, which is considerably tighter as compared to conventional pure pressing-in of a sealing element. One further advantage is that a simple and simultaneously cost-effective seal may be provided, since further additional processes for closing or sealing may be dispensed with.

Further features, advantages, and further specific embodiments of the present invention are described herein or become apparent as a result.

According to one advantageous refinement of the present invention, the channel and the sealing element are designed in such a way that the sealing element is sealingly fixed in the channel with the aid of an at least partial form fit. The advantage thereof is that a simple and simultaneously extremely reliable fixation of the sealing element and, thereby, a reliable and permanent seal is therefore made possible.

According to one further advantageous refinement of the present invention, the wall thickness of the channel is designed for forming the at least partial form fit. Therefore, a simple and simultaneously cost-effective design of the channel is possible in combination with a simultaneously reliable seal with the aid of the sealing element.

According to one further advantageous refinement of the present invention, the sealing element has a lesser elasticity than at least the section of the channel adjacent to the sealing element. Therefore, a simple insertion or pressing-in of the sealing element into the channel is ensured, since the sealing element is designed to be harder than the channel at the corresponding fixation point of the sealing element.

According to one further advantageous refinement of the present invention, the sealing element is made of metal, in particular steel, and/or the channel is made of plastic. Therefore, an insertion and fixation of the sealing element in the channel is made possible in a particularly simple way. Simultaneously, the channel may be manufactured extremely cost-effectively, for example, via injection molding.

According to one further advantageous refinement of the present invention, the channel encompasses a recess in the area adjacent to the sealing element for at least partially accommodating the sealing element. Therefore, an even more reliable fixation is possible, since the form fit of the sealing element with the channel may be supported, for example, by the corresponding recess or relief groove.

According to one further advantageous refinement of the present invention, the sealing element is designed in the shape of a sphere and the channel includes an essentially circular cross section. Therefore, a simple and cost-effective manufacture of the channel as well as an insertion of the sealing element is possible.

According to one further advantageous refinement of the present invention, the sealing unit includes an insertion chamfer, which is adapted to the sealing element and is designed, in particular, in the shape of a funnel. The advantage thereof is that a particularly simple introduction or insertion of the sealing element into the channel is possible.

If, for example, the sealing element is designed as a sphere, the insertion chamfer may be designed as a funnel including a circular cross section.

According to one further advantageous refinement of the present invention, the diameter of the sphere is greater than the diameter of the channel. Therefore, a mechanical clamping and a form-fitting connection are achieved in a particularly simple way.

Further features and advantages of the present invention result from the description herein and from the figures.

It is understood that the features, which are mentioned above and which will be described in greater detail in the following, are usable not only in the particular combination indicated, but also in other combinations or alone, without departing from the scope of the present invention.

Preferred embodiments and specific embodiments of the present invention are represented in the figures and are explained in greater detail in the following description, identical reference numerals relating to identical or similar or functionally identical components or elements.

DETAILED DESCRIPTION OF EXAMPLE EMBODIMENTS

Figure 1:
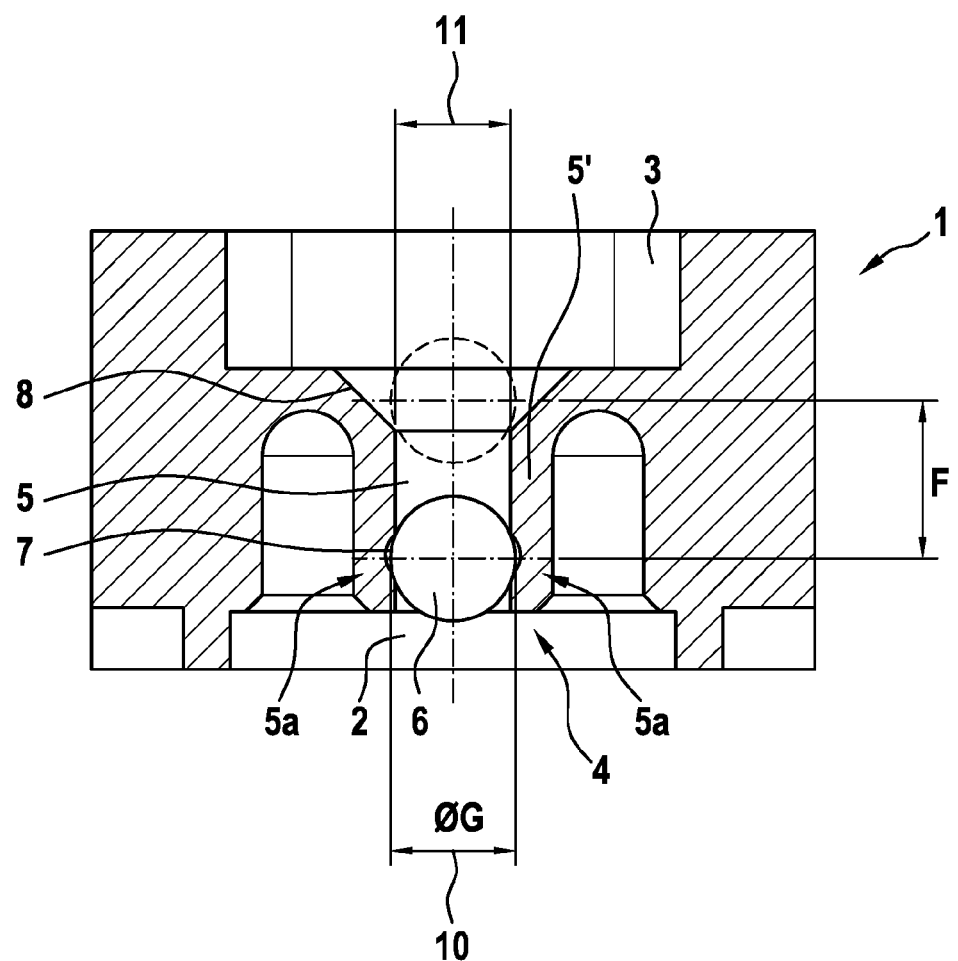
FIG. 1 schematically shows a device according to one specific example embodiment of the present invention in cross section.

FIG. 1 shows a device according to one specific example embodiment of the present invention in cross section.

FIG. 1 shows, in detail, a device 1 for sealing two spaces 2, 3 filled with different fluids. Spaces 2, 3 are fluidically connected to each other via a channel 5 of a sealing unit 4. A sphere 6, whose diameter 10 is greater than inner diameter 11 of channel 5, is inserted into channel 5. Sphere 6 is made of metal; channel 5 is made of plastic. Wall thickness 5' of channel 5 is selected in such a way or channel 5 is designed in such a way that a portion of an elastic deformation of channel 5 is made possible in area 5a of the position of sphere 6. As a result, a relaxation of the plastic, i.e., a recontraction of channel 5 after the insertion of sphere 6, is made possible, which provides a form fit of sphere 6 with channel 5. Additionally, in order to support the form fit, a recess 7, designed, for example, in the shape of a circle segment, may be situated in area 5a of the desired fixation position of sphere 6 in channel 5. This recess 7 makes it possible for sphere 6 to be additionally held in its axial position within channel 5 when acted upon by pressure.

At the upper end of channel 5 in FIG. 1, an insertion chamfer 8 is situated, which is designed in the shape of a funnel and is utilized for providing a simple insertion of sphere 6 into channel 5. In this case, the angle of funnel-shaped insertion chamfer 8 is approximately 45°, the height of the funnel, i.e., parallel to the axis of channel 5, being approximately 25% with respect to the overall length of channel 5. The press-in depth of sphere 6 into channel 5 is approximately 50% of the overall length of channel 5. Wall thickness 5' in relation to inner diameter 11 is approximately 33%. Overall, each of the pieces of information may be appropriately adapted or modified depending on the requirements, for example, with respect to materials or the like. Deviations of up to 75%, in particular up to 50%, preferably up to 25%, may take place in each case.

Figure 2:
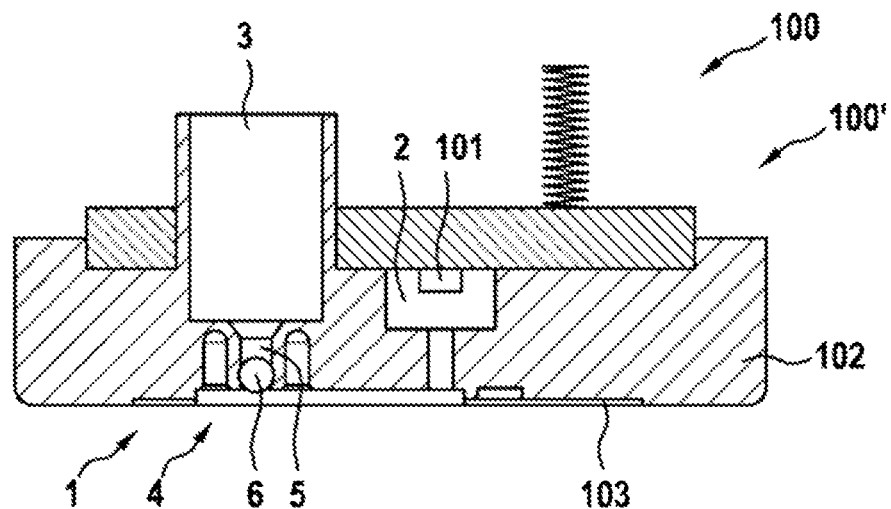
FIG. 2 schematically shows one portion of a pressure sensor according to one specific example embodiment of the present invention in cross section.

FIG. 2 shows one portion of a pressure sensor according to one specific example embodiment of the present invention in cross section.

FIG. 2 shows, in detail, device 1 according to FIG. 1 situated in an oil reservoir module 100' of a pressure sensor 100. Specifically, an oil frame 102 is situated, which includes a space 2, which is utilized as an oil reservoir. On the one hand, a sensor element in the form of a PorSi chip 101—PorSi refers to porous silicon—is connected to this space 2; on the other hand, a sealing unit 4 is situated on the side of space 2 facing away from sensor element 101 in order to seal space 2 and includes a channel 5, which is closed with the aid of a sphere 6 made of steel and, in this way, seals space 2, the oil reservoir, with respect to a second space 3.

Figure 3:
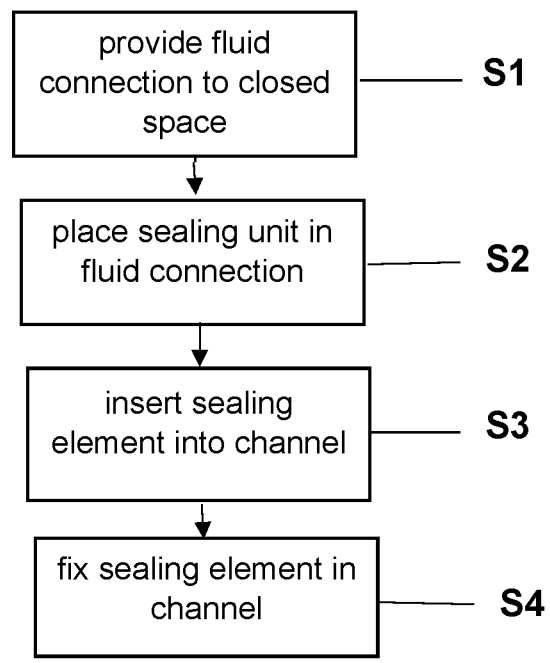
FIG. 3 schematically shows steps of a method according to one specific example embodiment of the present invention.

FIG. 3 shows steps of a method according to one specific example embodiment of the present invention.

FIG. 3 shows, in detail, a method for sealing two spaces filled with different fluids in a MEMS sensor system.

In a first step S1, a provision of a fluid connection to a closed space takes place. In a second step S2, a placement of a sealing unit in the fluid connection takes place, the sealing unit including a channel, which is connected to the space. In a third step S3, an insertion of a sealing element into the channel takes place. In a fourth step S4, a fixation of the sealing element in the channel takes place in order to seal the channel via a mechanical clamping.

In summary, at least one of the specific embodiments of the present invention has at least one of the following advantages:
  Physical separation of a sensor element and a refrigerant medium
  Cost-effective manufacture
  Implementation of a pressure sensor including a PorSi sensor element for air conditioning systems
  Simple, reliable sealing
  Permanent sealing Although the present invention was described on the basis of preferred exemplary embodiments, it is not limited thereto. Instead, the present invention is modifiable in various ways.

What is claimed is:

1. A sealing device for sealing between a first space filled with a first fluid in a MEMS sensor apparatus and a second space filled with a second fluid different from the first fluid, the sealing device, comprising:
  a sealing unit including a channel, wherein:
    the channel includes a first end connected to the first space filled with the first fluid and a second end connected to the second space filled with the second fluid different from the first fluid,
    the sealing unit includes a sealing element in a shape of a sphere, configured to seal the channel in the channel, the channel and/or the sealing element is configured in such a way that the sealing element is permanently fixed for sealing in the channel via a mechanical clamping, and
  the channel includes:
    a wall thickness designed in such a way that an elastic deformation is made possible in an area adjacent to the sealing element, and a recess formed in the area adjacent to the sealing element to partially accommodate the sealing element and hold the sealing element in an axial position of the channel.

2. The sealing device as recited in claim 1, wherein the channel and the sphere are configured in such a way that the sphere is sealingly situated in the channel using an at least partial form fit.

3. The sealing device as recited in claim 2, wherein the wall thickness of the channel is established to form the at least partial form fit.

4. The sealing device as recited in claim 1, wherein the sphere has a lesser elasticity than at least the section of the channel adjacent to the sphere.

5. The sealing device as recited in claim 4, wherein the sphere is made of metal, in particular steel, and/or the channel is made of plastic.

6. The sealing device as recited in claim 1, wherein the channel includes a circular cross section.

7. The sealing device as recited in claim 1, wherein the sealing unit includes an inclined chamfer for insertion which is disposed at the second end of the channel so as to be adapted to the sphere and is in the shape of a funnel.

8. The sealing device as recited in claim 6, wherein a diameter of the sphere is greater than a diameter of the channel.

9. A pressure sensor, comprising:
a sensor element situated in a first space and at least partially surrounded by a first fluid; and
a sealing unit that seals between the first space and a second space filled with a second fluid different from the first fluid, wherein:
the sealing unit includes a channel having a first end connected to the first space and a second end connected to the second space,
the sealing unit includes a sealing element in a shape of a sphere and configured to seal the channel in the channel,
the channel and/or the sealing element is configured in such a way that the sealing element is permanently fixed for sealing in the channel via a mechanical clamping, and
the channel includes:
a wall thickness designed in such a way that an elastic deformation is made possible in an area adjacent to the sealing element, and
a recess formed in the area adjacent to the sealing element to partially accommodate the sealing element and hold the sealing element in an axial position of the channel.

10. The pressure sensor as recited in claim 9, wherein the pressure sensor is for use in an air conditioning system in a vehicle.

* * * * *